United States Patent
Van Der Zee

Patent Number: 6,100,750
Date of Patent: Aug. 8, 2000

[54] FREQUENCY-INDEPENDENT VOLTAGE DIVIDER

[75] Inventor: Pieter Van Der Zee, Nijmegen, Netherlands

[73] Assignee: U.S. Philips Corporation, New York, N.Y.

[21] Appl. No.: 09/066,472

[22] PCT Filed: Jul. 18, 1997

[86] PCT No.: PCT/IB97/00900

§ 371 Date: Apr. 27, 1998

§ 102(e) Date: Apr. 27, 1998

[87] PCT Pub. No.: WO98/09376

PCT Pub. Date: Mar. 5, 1998

[30] Foreign Application Priority Data

Aug. 29, 1996 [EP] European Pat. Off. ............. 96202384

[51] Int. Cl.[7] .................................................. H01J 19/82
[52] U.S. Cl. ........................... 327/531; 327/362; 327/540
[58] Field of Search ............................. 307/36; 327/362, 327/530, 531, 538, 540, 519

[56] References Cited

U.S. PATENT DOCUMENTS

| 4,586,008 | 4/1986 | Raleigh | 333/19 |
| 4,968,901 | 11/1990 | Shacter | 307/360 |
| 5,589,790 | 12/1996 | Allen | 327/333 |
| 5,600,276 | 2/1997 | Imamura et al. | 327/362 |
| 5,631,598 | 5/1997 | Miranda et al. | 327/540 |
| 5,898,312 | 4/1999 | Uhling et al. | 324/754 |

FOREIGN PATENT DOCUMENTS

| 0013173B1 | 7/1980 | European Pat. Off. . |
| 0051902A1 | 5/1982 | European Pat. Off. . |
| 4217408C1 | 11/1993 | Germany . |

*Primary Examiner*—Timothy P. Callahan
*Assistant Examiner*—Jung Ho Kim
*Attorney, Agent, or Firm*—Steven R. Biren

[57] ABSTRACT

A frequency-independent voltage divider includes a series arrangement of resistors connected between an input terminal and a reference terminal for receiving an input signal. An output terminal for supplying an output signal is coupled to a tap of the series arrangement. The influence of parasitic capacitances is eliminated by compensation capacitors.

4 Claims, 3 Drawing Sheets

FREQUENCY-INDEPENDENT VOLTAGE DIVIDER

BACKGROUND OF THE INVENTION

The invention relates to a frequency-independent voltage divider comprising a reference terminal; an input terminal for receiving an input signal with respect to the reference terminal; an output terminal for supplying an output signal with respect to the reference terminal; and a series arrangement of resistors coupled between the input terminal and the reference terminal, which resistors are connected to one another in nodes, of which nodes at least node is loaded by at least one respective parasitic capacitor coupled between the reference terminal and the at least one node, and of which nodes the at least one node is coupled to the input terminal via a respective compensation capacitor.

Such a frequency-independent voltage divider is known from the general state of the art. An example of this is an oscilloscope probe comprising a series arrangement of two resistors coupled between the input terminal and the reference terminal. The two series-connected resistors have their common node connected to the output terminal. The output terminal and the reference terminal are connected to an input of an oscilloscope. The input of the oscilloscope behaves substantially as a parasitic capacitance with respect to the oscilloscope probe. As a result of this, the oscilloscope probe in conjunction with the parasitic capacitance would behave not only as a voltage divider but also as a low-pass filter, if the oscilloscope had not been provided with a compensation capacitor coupled between the input terminal and the node common to the two series-connected resistors. Thus, a frequency-independent voltage divider is obtained when the oscilloscope probe is suitably dimensioned.

SUMMARY OF THE INVENTION

It is an object of the invention to provide an improved frequency-independent voltage divider.

To this end, according to the invention, a frequency-independent voltage divider of the type defined in the opening paragraph is characterized in that the series arrangement of resistors comprises at least three resistors, and the number of compensation capacitors is at least two. The series arrangement of resistors now has a plurality of nodes. At option, the output terminal can be connected to one of the nodes. It is also possible to take off a plurality of output signals at the same time by coupling different output terminals to different nodes. Thus, it is possible that a plurality of these different nodes are loaded by a parasitic capacitor. It may be desirable that all the nodes provide output signals which are frequency-independent. The invention meets this requirement by the provision of a plurality of compensation capacitors.

The invention further relates to a frequency-independent voltage divider comprising a reference terminal; an input terminal for receiving an input signal with respect to the reference terminal; an output terminal for supplying an output signal with respect to the reference terminal; and a conductor track having a first end and a second end coupled to the reference terminal and the input terminal, respectively, which conductor track has a tap coupled to the output terminal, and which conductor track is loaded by a distributed parasitic capacitor constituted by the conductor track, a conductive substrate, which is coupled to the reference terminal, and an insulator, which isolates the conductor track electrically from the conductive substrate.

The invention is further characterized in that the frequency-independent voltage divider comprises a distributed compensation capacitor having one side coupled to the input terminal and having another side coupled to the conductor track in a distributed fashion. The conductor track, the distributed parasitic capacitance, and the distributed compensation capacitance respectively correspond to the series arrangement of resistors, the parasitic capacitor, and the compensation capacitor. This correspondence can be understood when the conductor track is regarded as an infinite number of infinitesimal series-connected resistors.

German Patent Specification DE 42 17 408 C1 describes a frequency-independent voltage divider which also comprises a conductor track and a distributed parasitic capacitance. However, it does not include a (distributed) compensation capacitor. The frequency-independent voltage divider shown therein operates in accordance with a different principle. FIG. 1 of said Patent Specification shows that not all the parasitic capacitors are coupled to the reference terminal. However, the parasitic capacitors coupled to the input terminal cannot be regarded as compensation capacitors in accordance with the present invention because they are not coupled to the nodes which are also coupled to parasitic capacitors.

The invention is further characterized in that the distributed compensation capacitor is constituted by the conductor track, a further conductor track, which covers the conductor track at least partly and is coupled to the input terminal, and a further insulator, which isolates the conductor track electrically from the further conductor track.

The invention is still further characterized in that the width of the further conductor track is dependent upon the relative position of the conductor track with respect to the first end and the second end. Thus, it is achieved that by a suitable choice of the variation of the width of the further conductor track the output signal or output signals (in the case of a plurality of output terminals) is or are frequency-independent (only, of course, if the input signal is frequency-independent), regardless of the relative position of the tap or taps on the conductor track with respect to the first end and the second end.

BRIEF DESCRIPTION OF THE DRAWING

The invention will be described in more detail with reference to the accompanying drawings, in which.

DESCRIPTION OF THE PREFERRED EMBODIMENTS

In these Figures like parts or elements bear the same reference symbols.

Figure 1:
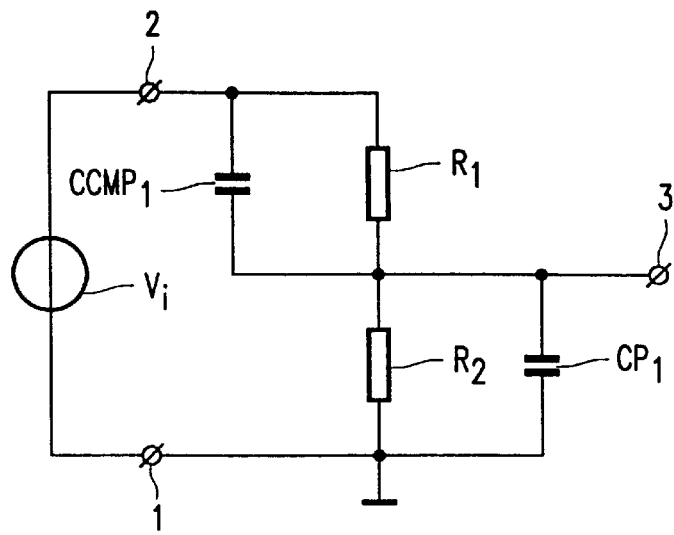
FIG. 1 shows a frequency-independent voltage divider as known from the general state of the art.

FIG. 1 shows a frequency-independent voltage divider as known from the general state of the art. The frequency-independent voltage divider has a reference terminal 1, an input terminal 2, and an output terminal 3. The frequency-independent voltage divider further comprises a series arrangement of resistors $R_1$, $R_2$ coupled between the input terminal 2 and the reference terminal 1. The resistors $R_1$, $R_2$ are interconnected in a node, which is also connected to the output terminal 3. An input signal $V_i$ is applied between the input terminal 2 and the reference terminal 1. An output signal is available between the output terminal 3 and the reference terminal 1. However, it is also possible to take off the output signal between the input terminal 2 and the output terminal 3. Owing to a parasitic capacitor $CP_1$ coupled between the output terminal 3 and the reference terminal 1 the signal transfer, i.e. the ratio between the output signal and the input signal $V_i$, is dependent on the frequency of the input signal $V_i$. In order to prevent this, a compensation capacitor $CCMP_1$ is coupled between the input terminal 2 and the output terminal 3. The signal transfer is independent of the frequency of the input signal $V_i$ if the mathematical relationship [1] is satisfied:

$$R_1/R_2 = CP_1/CCMP_1 \quad [1]$$

Figure 2:
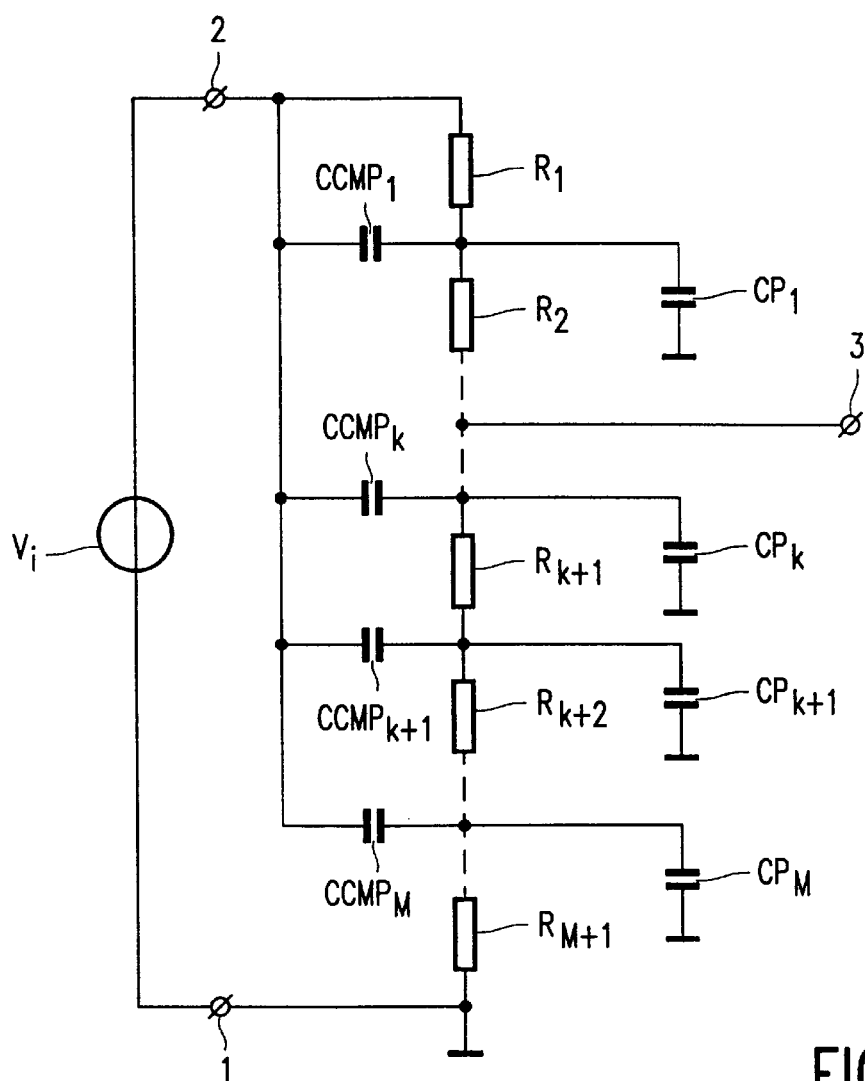
FIG. 2 shows a first embodiment of a frequency-independent voltage divider in accordance with the invention.

FIG. 2 shows a first embodiment of a frequency-independent voltage divider in accordance with the invention. The series arrangement of resistors comprises more than two resistors $R_1$–$R_{M+1}$. An arbitrary node of the series arrangement can be loaded by a parasitic capacitor $CP_k$. A compensation capacitor $CCMP_k$ is coupled between the relevant arbitrary node and the input terminal 2. For the following explanation it is assumed that each node is loaded exclusively with one of the parasitic capacitors $CP_1$–$CP_M$ and that each node is coupled exclusively to one of the compensation capacitors $CCMP_1$–$CCMP_M$. The capacitance value of the relevant parasitic capacitor $CP_k$ and that of the relevant compensation capacitor $CCMP_k$ is said to be zero in the case of a node which, in actual fact, is not loaded by a parasitic capacitor $CP_k$ and which, as a consequence, does not require a compensation capacitor $CCMP_k$. The signal transfer to an arbitrary node is frequency-independent if for each sequence number k (k=1, 2, 3, . . . M) the mathematical relationship [2] is satisfied:

$$(R_1+R_2+\ldots R_k)/(R_{k+1}+R_{k+2}+\ldots R_{M+1})=CP_k/CCMP_k \quad [2]$$

In order to clarify the mathematical relationship [2], it is assumed, by way of example, that the number of resistors is three, i.e. M=2 and k=1, 2. From the mathematical relationship [2] it follows that relationships $$R_1/(R_2+R_3)=CP_1/CCMP_1 \quad (k=1) \text{ and}$$

$$(R_1+R_2)/R_3=CP_2/CCMP_2 \quad (k=2)$$

should be satisfied.

If the above criteria are met all the signal transfers from the input terminal to the nodes are frequency-independent of the input signal $V_i$. Therefore, it is possible to couple a plurality of output terminals to a plurality of nodes in order to take off a plurality of (different) output signals which are all frequency-independent.

A frequency-independent voltage divider based on the inventive principle can be realized by means of an integrated resistor. This is because an integrated resistor may be regarded as an infinite number of infinitesimal series-connected resistors $R_1$–$R_{M+1}$ (M approximating to infinite).

Figure 3:
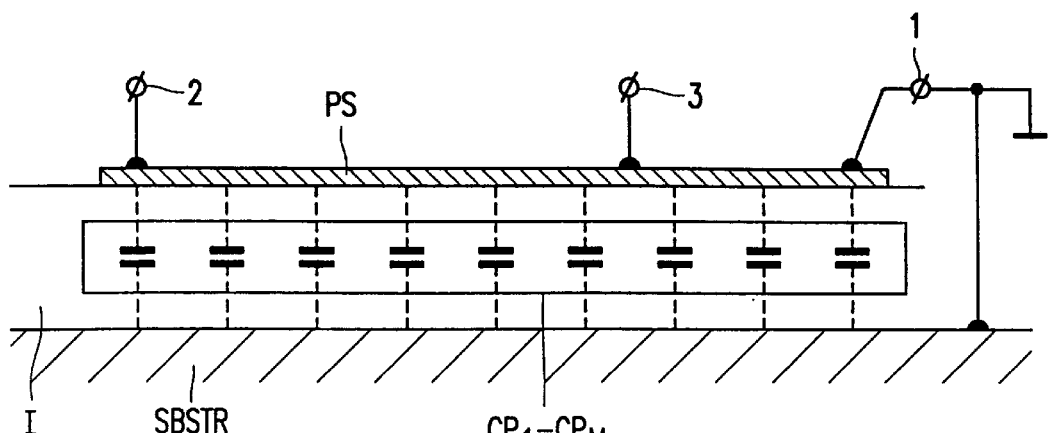
FIG. 3 is a simplified cross-sectional view of an integrated resistor as known from the general state of the art.

FIG. 3 is a simplified cross-sectional view of an integrated resistor as known from the general state of the art. The integrated resistor comprises a conductor track PS having a first end and a second end coupled to the reference terminal 1 and the input terminal 2, respectively. The conductor track PS has a tap coupled to the output terminal 3. The conductor track PS is isolated from a conductive substrate SBSTR by means of an isolator I, the substrate being coupled to the reference terminal 1. The conductor track PS, the insulator I, and the conductive substrate SBSTR can be formed by, for example, polysilicon, silicon dioxide, and doped silicon. The conductor track PS, the insulator I and the conductive substrate SBSTR form a distributed parasitic capacitor $CP_1$–$CP_M$, which loads the integrated resistor with respect to the reference terminal 1. The distributed parasitic capacitor $CP_1$–$CP_M$ can be regarded as an infinite number of infinitesimal parasitic capacitors $CP_1$–$CP_M$ (M approximating to infinite).

Figure 4:
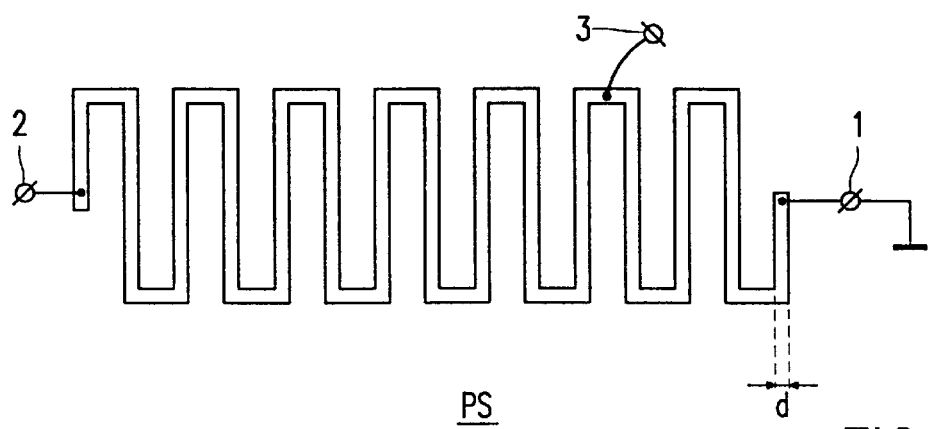
FIG. 4 is a plan view of a folded integrated resistor.

FIG. 4 is a plan view of a folded integrated resistor.

Figure 5:
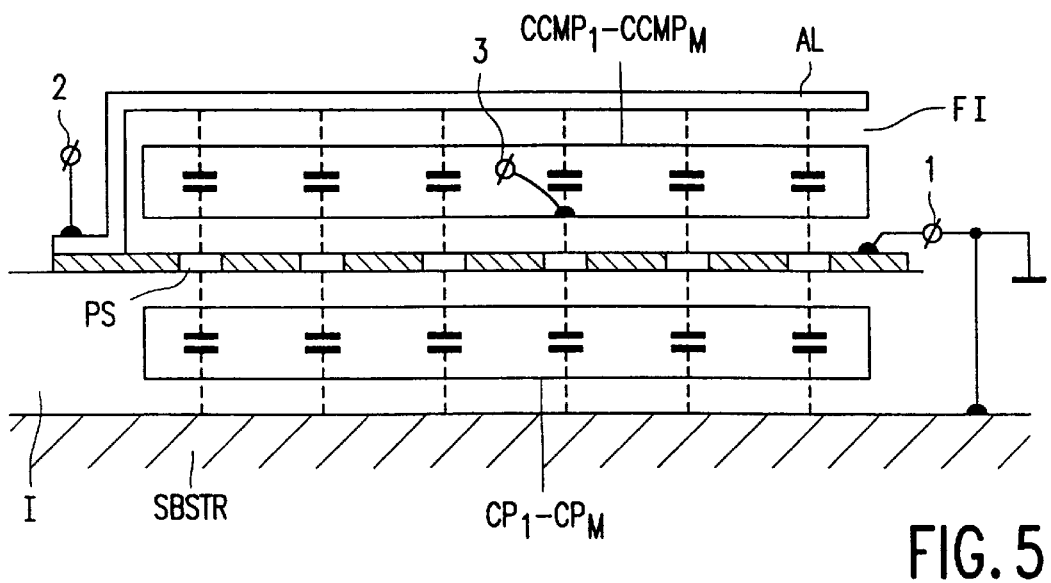
FIG. 5 is a simplified cross-sectional view of an integrated frequency-independent voltage divider in accordance with the invention.

FIG. 5 is a simplified cross-sectional view of an integrated frequency-independent voltage divider in accordance with the invention. The conductor track PS can be a folded resistor as shown in FIG. 4. The conductor track may also be constructed in another manner. In addition to the elements already shown in FIG. 3, FIG. 5 shows a further conductor track AL, coupled to the input terminal 2, and a further insulator FI, which isolates the conductor track PS electrically from the further conductor track AL. The further conductor track AL and the further insulator FI can be made of, for example, aluminum and silicon dioxide, respectively. The further conductor track AL, the further insulator FI, and the conductor track PS form a distributed compensation capacitor $CCMP_1$–$CCMP_M$ having one side coupled to the input terminal 2 and having its other side coupled to the conductor track PS in a distributed fashion.

Figure 6:
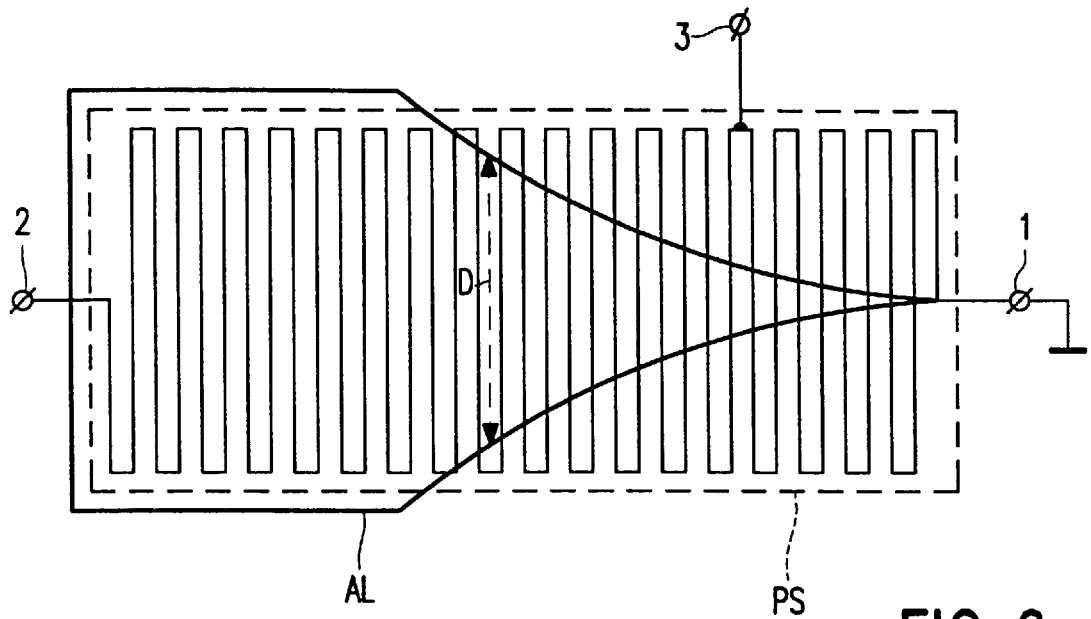
FIG. 6 is a plan view of a second embodiment of a frequency-independent voltage divider in accordance with the invention.

FIG. 6 is a plan view showing a second embodiment of a frequency-independent voltage divider in accordance with the invention. By way of example, it is assumed that the conductor track PS has a constant width d, as indicated in FIG. 4, and that the insulator is of a homogeneous composition. This means that the sheet capacitance, i.e. the capacitance value per unit area, of the distributed parasitic compensation capacitor $CCMP_1$–$CCMP_M$ is the same anywhere between the conductor track PS and the conductive substrate SBSTR. Referring to FIG. 2, this implies that the following holds:

$$CP_1=CP_2=\ldots=CP_M \quad [3]$$

From FIG. 2 and the mathematical relationship [2] it will be apparent that for a frequency-independent signal transfer the following requirement is to be met:

$$CCMP_1>CCMP_2>\ldots>\ldots>CCMP_M \quad [4]$$

For this purpose, it is required that (in the ideal case) the width D of the further conductor track AL increases from zero to infinite, viewed from right to left (in FIG. 6). However, there is no point in making the width D so large that the further conductor track AL extends into an area underneath which the conductor track PS does not extend.

In an integrated circuit the available thin oxide and the available thick oxide can be used for the further insulator FI. Since a maximal capacitance value of the distributed compensation capacitor $CCMP_1$–$CCMP_M$ is required at the left in FIG. 6, the choice for a thin oxide seems to be most obvious. However, as can be understood by means of FIG. 2, the voltage drop across the part of the distributed compensation capacitor $CCMP_1$–$CCMP_M$ is largest at the right-hand side of FIG. 6 (close to the reference terminal 1). This justifies the choice of a thick oxide in view of the risk of breakdown of the thin oxide.

Figure 7:
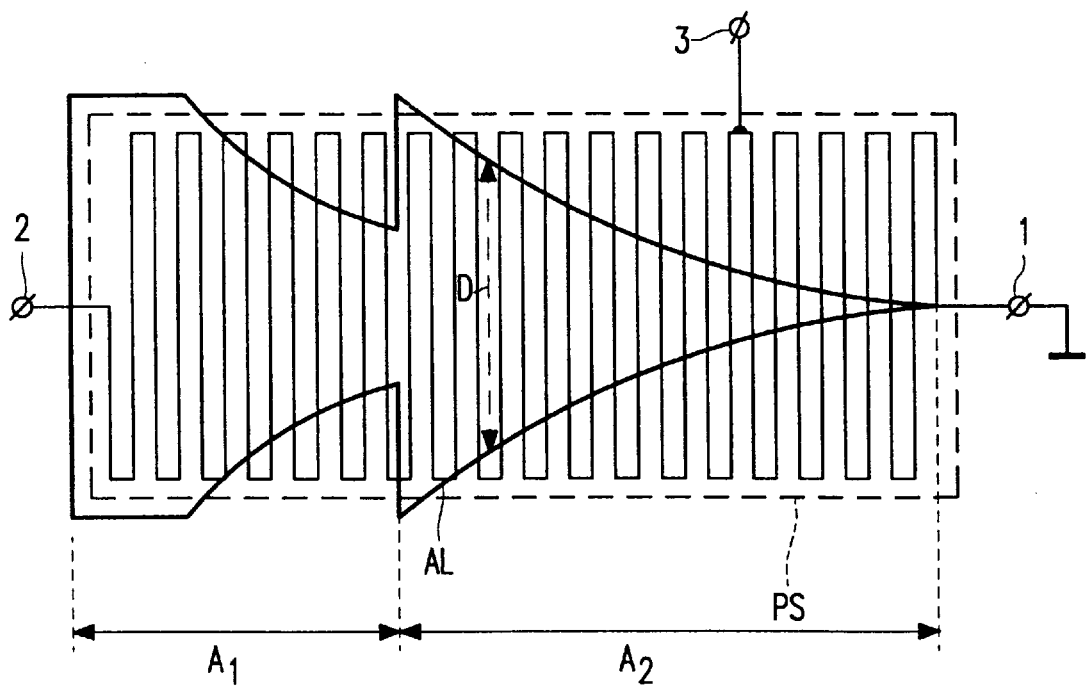
FIG. 7 is a plan view of a third embodiment of a frequency-independent voltage divider in accordance with the invention.

FIG. 7 is a plan view of a third embodiment of a frequency-independent voltage divider in accordance with the invention. The above dilemma as regards the choice for the use of thin or thick oxide is solved by the use of thin oxide in the area $A_1$ and thick oxide in the area $A_2$. The adapted variation in the thickness D of the further conductor track is a logical consequence of this.

A voltage divider in accordance with the invention can be used inter alia in conjunction with an amplifier circuit such as an operational amplifier. In the case of an integrated circuit a possible voltage dependence of the distributed parasitic capacitor $CP_1$–$CP_M$ can be reduced by means of the so-termed double-sided resurf effect by creating a buried layer underneath the conductor track PS.

What is claimed is:

1. A frequency-independent voltage divider comprising a reference terminal (1); an input terminal (2) for receiving an input signal ($V_i$) with respect to the reference terminal (1); an output terminal (3) for supplying an output signal with respect to the reference terminal (1); and a series arrangement of resistors ($R_1$, $R_2$, $R_{k+}$) coupled between the input terminal (2) and the reference terminal (1), which resistors are connected to one another in nodes, of which nodes at least two nodes are loaded by at least two respective parasitic capacitors each ($CP_1$, $CP_k$) coupled between the reference terminal (1) and a respective one of the at least two nodes, and of which nodes the at least two nodes are coupled directly to the input terminal (2) via respective compensation capacitors ($CCMP_1$, $CCMP_M$), wherein the series arrangement of resistors comprises at least three resistors ($R_1$–$R_{M+1}$), and the number of compensation capacitors ($CCMP_1$–$CCMP_M$) is at least two.

2. A frequency-independent voltage divider comprising a reference terminal (1); an input terminal (2) for receiving an input signal ($V_i$) with respect to the reference terminal (1); an output terminal (3) for supplying an output signal with respect to the reference terminal (1); and a conductor track (PS) having a first end and a second end coupled to the reference terminal (1) and the input terminal (2), respectively, which conductor track (PS) has a tap coupled to the output terminal (3), and which conductor track (PS) is loaded by a distributed parasitic capacitor ($CP_1$–$CP_M$) constituted by the conductor track (PS), a conductive substrate (SBSTR), which is coupled to the reference terminal (1), and an insulator (I), which isolates the conductor track (PS) electrically from the conductive substrate (SBSTR), characterized in that the frequency-independent voltage divider comprises a distributed compensation capacitor ($CCMP_1$–$CCMP_M$) having one side coupled to the input terminal (2) and having another side coupled to the conductor track (PS) in a distributed fashion.

3. A frequency-independent voltage divider as claimed in claim 2, characterized in that the distributed compensation capacitor ($CCMP_1$–$CCMP_M$) is constituted by the conductor track (PS), a further conductor track (AL), which covers the conductor track (PS) at least partly and is coupled to the input terminal (2), and a further insulator (FI), which isolates the conductor track (PS) electrically from the further conductor track (AL).

4. A frequency-independent voltage divider as claimed in claim 3, characterized in that the width of the further conductor track (AL) is dependent upon the relative position of the conductor track (PS) with respect to the first end and the second end.

* * * * *